US006650190B2

(12) United States Patent
Jordan et al.

(10) Patent No.: US 6,650,190 B2
(45) Date of Patent: Nov. 18, 2003

(54) RING OSCILLATOR WITH ADJUSTABLE DELAY

(75) Inventors: Richard Jordan, Hinesburg, VT (US); Anthony J. Perri, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 59 days.

(21) Appl. No.: 09/832,712

(22) Filed: Apr. 11, 2001

(65) Prior Publication Data

US 2002/0171496 A1 Nov. 21, 2002

(51) Int. Cl.[7] .............................................. H03K 3/354
(52) U.S. Cl. ............................. 331/57; 331/74; 331/17
(58) Field of Search .......................... 331/57, 185, 74, 331/176, 177 R, 179, 1 A, 17

(56) References Cited

U.S. PATENT DOCUMENTS

| 4,458,165 | A | * | 7/1984 | Jackson | 327/276 |
|---|---|---|---|---|---|
| 4,833,695 | A | * | 5/1989 | Greub | 331/1 A |
| 5,061,907 | A | * | 10/1991 | Rasmussen | 331/57 |
| 5,331,295 | A | * | 7/1994 | Jelinek et al. | 331/57 |
| 5,418,499 | A | * | 5/1995 | Nakao | 331/57 |
| 5,703,541 | A | * | 12/1997 | Nakashima | 327/261 |
| 5,847,617 | A | * | 12/1998 | Reddy et al. | 331/57 |
| 5,896,069 | A | * | 4/1999 | Williams et al. | 327/270 |
| 5,956,289 | A | * | 9/1999 | Norman et al. | 365/233 |
| 6,157,267 | A | | 12/2000 | Kakimura | 331/57 |
| 6,262,616 | B1 | * | 7/2001 | Srinivasan et al. | 327/264 |
| 6,271,729 | B2 | * | 8/2001 | Sung et al. | 327/156 |

* cited by examiner

Primary Examiner—Robert Pascal
Assistant Examiner—Joseph Chang
(74) Attorney, Agent, or Firm—McGinn & Gibb, PLLC; Richard A. Henkler, Esq.

(57) ABSTRACT

A variable-frequency digital ring oscillator provides small and consistent frequency adjustments throughout a locked range. The ring oscillator of the invention is standard cell placeable and operates at the technology limits to provide small and precise delay changes that is inexpensive to implement. The digital variable-frequency ring oscillator includes multiple macro delay elements forming an inverter ring circuit, each element having an individual macro delay unit that in turn is comprised of multiple adjustable delay units. All of these adjustable delay units are controlled by a single delay control signal.

17 Claims, 5 Drawing Sheets

| FINE BOOST CONTROL 130 | BOOST NUMBER 135 | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 |
| 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 1 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| : | | | | | | | | | | | | | | | | | | | | | | | | | | | | | | | | |
| 30 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 0 |
| 31 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |

FIG.5

RING OSCILLATOR WITH ADJUSTABLE DELAY

BACKGROUND OF THE INVENTION

1. Field of the Invention

The present invention relates generally to oscillators, and more particularly to a variable-frequency, digitally controlled ring oscillator with adjustable delay.

2. Description of the Related Art

There are numerous integrated circuit (IC) applications where, for proper operation, it is necessary to provide precise timing or synchronization of one portion of a circuit with another. Such timing is generally provided by a local oscillator whose frequency is sufficiently accurate for the requirements of the circuit being timed or synchronized. Depending on the degree of accuracy required, an oscillator may be very simple and inexpensive where frequency range can have a wide range, or relatively complex and expensive where accuracy (less than a few percent error) in frequency is required. It is desirable to have an oscillator which is both simple and inexpensive, and yet operates at an accurate frequency.

Complementary metal oxide semiconductor (CMOS) manufacturing technology is highly developed, and for many applications, is the technology of choice in designing and implementing large scale integrated circuits. Various kinds of oscillators have been used for on-board timing of other circuitry on CMOS integrated circuits. One kind of oscillator readily used by CMOS technology is a ring oscillator. In this kind of oscillator, there are no inductor-capacitor tuned circuits, which in other oscillators are used to accurately set the frequency of operation. Instead of tuned circuits, a ring oscillator has an odd number of identical and very simple inverting stages connected in series, with an output of each stage coupled to an input of the next stage and with the output of the last stage coupled to the input of the first stage. In one embodiment, each stage is an inverter having a pair of serially connected CMOS transistors whose output switches to a high level, a "1", when a low level, a "0" is applied to the input thereof and switches to a "0" when a "1" is applied to the input thereof. The frequency of operation of this type of oscillator is determined by the speed of progression of a switching event of "1" to "0", and "0" to "1" from one stage to another around the ring, and by the number of stages. A conventional CMOS ring oscillator as part of an IC chip may have its own frequency of operation within a range of frequencies. When precise timing of a circuit is required (e.g., frequency accuracy to within a few percent), delay control logic circuits are part of the ring oscillator circuit that are used to compensate for processes during manufacture, synchronizing data to be in-phase, or for a controlled fixed frequency.

One design of a ring oscillator circuit with delay compensation includes a capacitive load added at the output for adjustable delay. In such a design, the resistance of load devices is highly temperature sensitive. Variations in resistance are due primarily to changes in surface carrier mobility with temperature. When a time constant generating circuit is constructed on an integrated circuit using a resistive load device and an ordinarily constructed integrated circuit capacitor, the RC time constant varies significantly with changes in temperature. This creates great problems in stabilizing the oscillator frequency. Another problem with this type of design includes less accurate adjustment. Also, this design is typically too large to implement in CMOS circuits.

Another ring oscillator 10, shown in FIG. 1, includes a truncation logic ring control design. Multiple inverters 20 connect in multiple loops 30 that junction at a multiplexer 40. Dynamic truncation of the ring maintains a locked predetermined output signal 50 (OSC_OUT). This design is similarly disclosed in a sophisticated design in U.S. Pat. No. 6,157,267 (hereinafter "267 patent"), which is hereby incorporated by reference.

One problem encountered with such a design includes the nature of the truncation loops which have embedded counters (a 50% duty cycle oscillator signal cannot be generated). Since each truncation loop in the 267 patent includes a delay element, a counter, and gating logic, the minimum achievable delay for a given truncation loop is dependent on the sum of these three elements which restricts the maximum oscillator frequency obtainable for a given application.

In FIG. 1, the ring oscillator 10 uses truncation which creates large monotonic steps when varying frequency. The delay control switching logic circuit 20 generally creates different phase steps at these truncation locations 30 that is minimal (i.e., much less than 2:1). Problems inherent with this oscillator design include it being larger and typically more complex, which creates different phase steps in the multiple truncation locations 30 which are not the same.

Therefore, it is desirable to have a ring oscillator design that is relatively inexpensive, yet generates an output frequency signal that can be set to a desired level of accuracy using a logic controller and a single delay control signal that is the same to all portions of the inverter ring. The present invention provides an effective and inexpensive solution to this problem of accuracy in frequency of operation of a digital ring oscillator for implementation by CMOS technology as part of an IC chip using standard cell placement.

SUMMARY OF THE INVENTION

It is a primary object of the present invention to provide a digital variable-frequency digital ring oscillator having multiple element paths, wherein an output frequency of the oscillator has adjustable delay that can be directly controlled by a single control signal connected to each macro delay forming the inverter ring circuit.

To achieve the above object, the present invention provides a pulse circulating circuit formed by connecting inverters in a ring configured in discrete macro delay loops to generate an output signal by circulating a pulse signal, thus forming a digital oscillator. The oscillator functions so that the output frequency of the pulse circulating circuit is changed by increasing or decreasing the number of the macro delay units by an initial acquisition of a desired operational frequency by truncating the multiple element paths. An important characteristic of this macro delay unit comprises a temperature compensation section that is part of each macro delay unit circuit forming the ring of inverters. The macro delay units are serially connected as fine delay inverter units, each provide small and precise delay changes, thereby providing greater flexibility in controlling both the frequency of operation of the oscillator and the wave shape of the output signal. The digital oscillator is well suited for implementation by CMOS technology as part of an IC chip using standard cell placement. The present invention achieves very fine delay adjustments by increasing or decreasing the drive strength of inverting delay elements, thus creating a variable delay element. By using the most basic logic function as the variable delay element, the maximum oscillation frequencies for a given technical application can be realized. The present invention uses a hybrid approach of a truncation ring structure where the truncation loops are comprised of variable delay elements. This allows the truncation ring to be set as a fixed truncation loop following a coarse acquisition. The variable delay elements are then used to track the target frequency.

BRIEF DESCRIPTION OF THE DRAWINGS

The foregoing and other objects, aspects and advantages will be better understood from the following detailed description of preferred embodiments of the invention with reference to the drawings, in which:

FIG. 5 shows a truth table of a thermometer encoder.

DETAILED DESCRIPTION OF PREFERRED EMBODIMENTS OF THE INVENTION

This invention relates to a variable-frequency digital ring oscillator that provides small and consistent phase steps throughout the operational range. The ring oscillator circuit of the invention is standard cell placeable and operates at the technology limits to provide small and precise delay changes that is inexpensive to implement. The digital variable-frequency ring oscillator includes multiple macro delay elements 120 forming the inverter ring circuit, each element is comprised of multiple adjustable fine delay units 125. All of the delay units are controlled by a single delay control signal.

Figure 1:
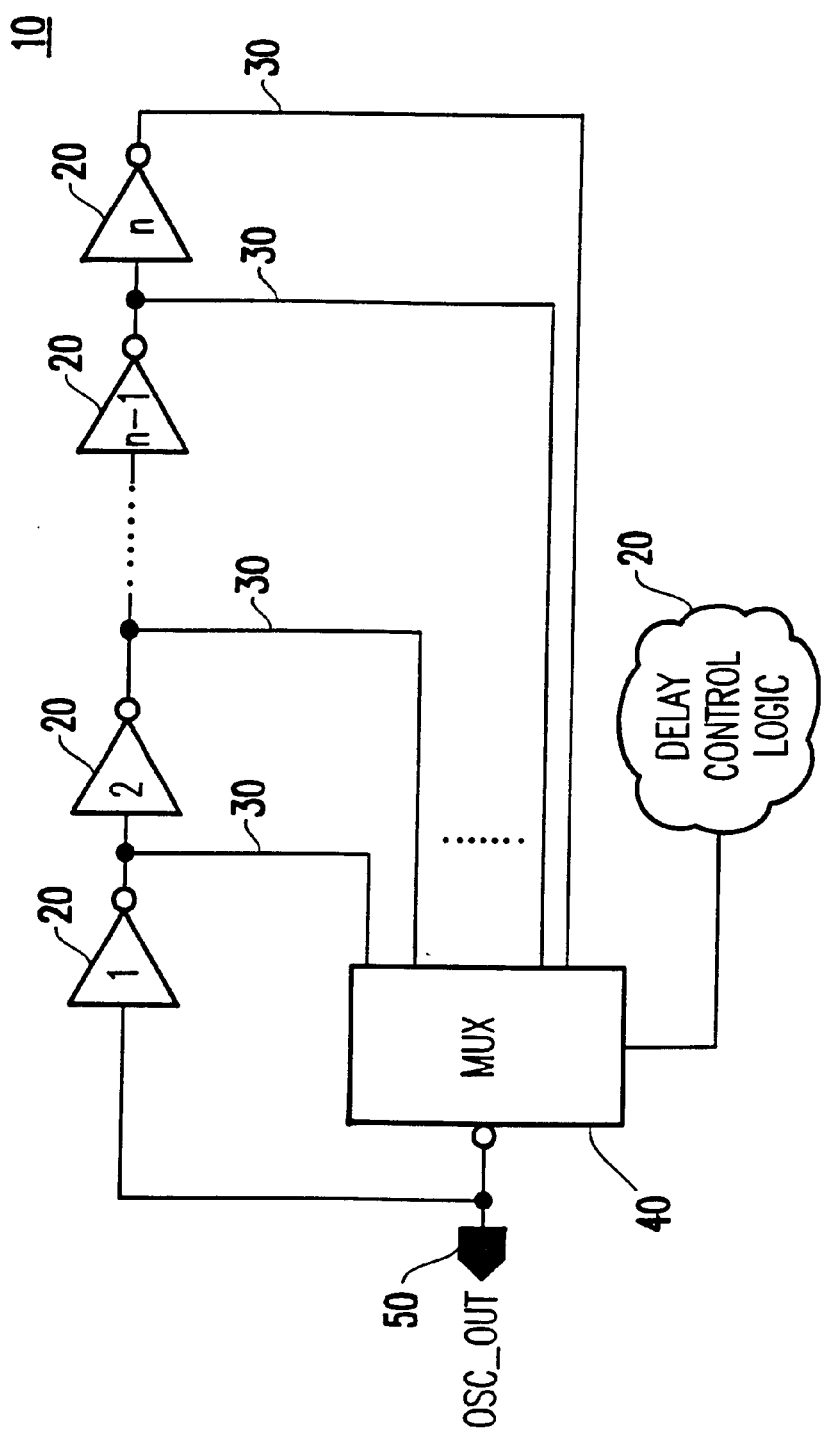
FIG. 1 shows a schematic of a conventional digitally controlled oscillator.
Figure 2:
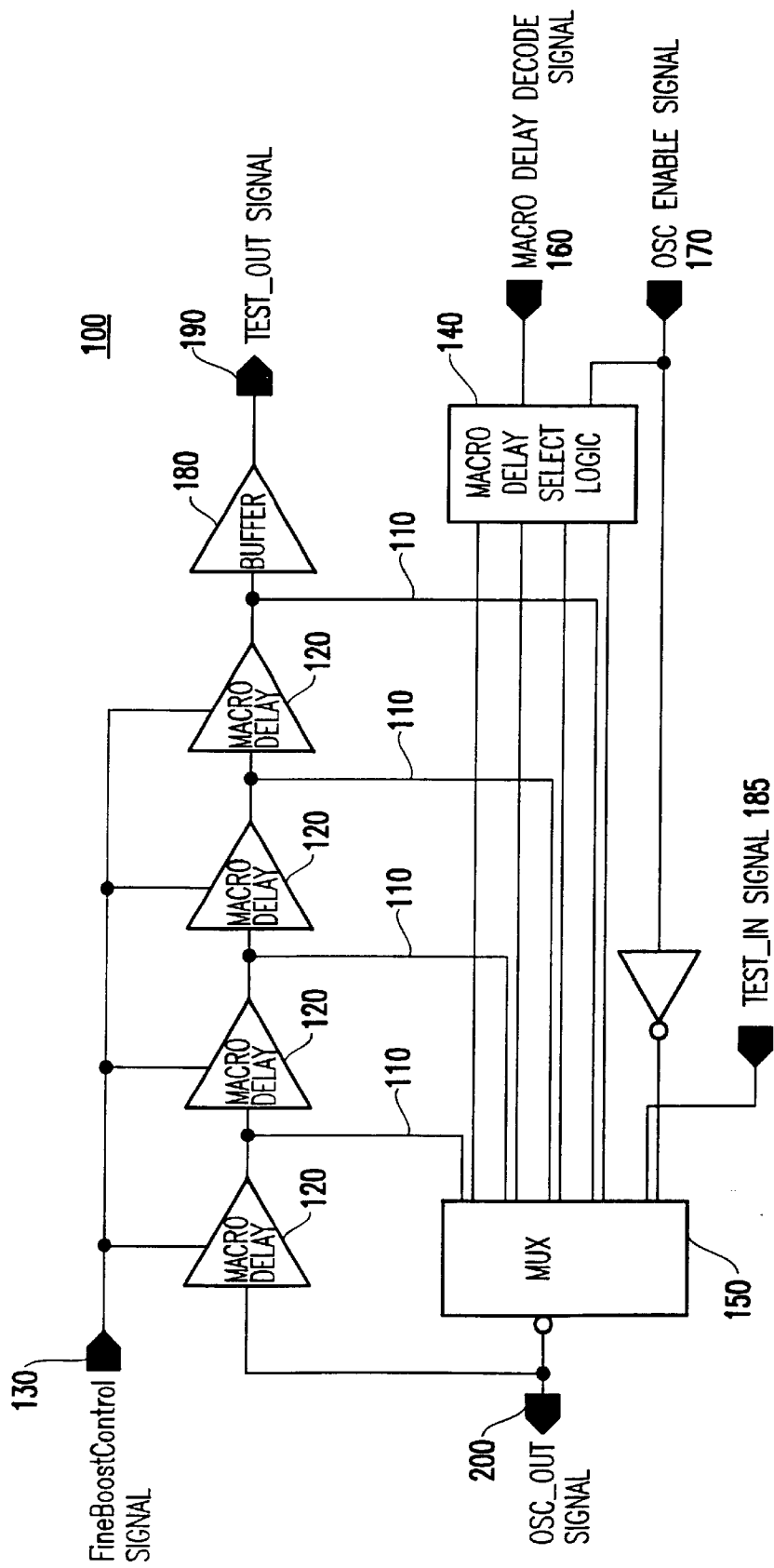
FIG. 2 shows a schematic of a digitally controlled oscillator embodying the present invention.

Referring now in specific detail to the drawings in which like reference numerals and block identification identify similar or identical elements throughout the several views, and initially to FIG. 2, an improved digital ring oscillator circuit 100 is shown in a hybrid ring circuit form using truncation for an initial desired frequency acquisition. Variability of frequency is effectuated by selecting one of the multiple macro delay loops 110 that are attached at discrete stepped sections. Multiple macro delay units 120 are connected serially to each other, each form part of the macro delay loop 110 and have the same adjustable delay input control signal 130 (Fine Boost Control signal). This design enables consistent and precise frequency adjustments while locked, yet allows a full operational range of frequencies without step-type frequency changes.

A macro delay select logic control unit 140 controls initial truncation among the delay loops 110 for a desired operational frequency and maintains this truncation point, which provides consistent frequency adjustment while in a locked state. External loop control logic inputs the same adjustable delay input control signal 130 to each of the macro delay units 120 for temperature compensation drift and voltage fluctuation. The macro delay select logic unit 140 decodes signals from the external macro delay control logic into a 1-of-8 selection via the multiplexer 150 for ring truncation. The macro delay select logic control unit 140 includes the multiplexer unit 150.

The multiplexer 150 includes logic control circuitry for truncation of the macro delay loops 110. The multiplexer 150 inverts the signal from the acquired macro delay unit 120 to create an oscillator from the delay line as a locked output signal 200 (OSC_OUT). The 8:1 multiplexer 150 allows for up to 7 macro delay loops 110. The remaining multiplexer 150 input is reserved for use by a test input signal 185 to the macro delay chain. As would be known by one ordinarily skilled in the art given this disclosure, the 8:1 multiplexor 150 is merely exemplary and different multiplexors can be used with the invention. Therefore, the invention is not limited to the specific multiplexor shown in FIG. 2.

The output buffer 180 maintains a constant load on the multiple macro delay units 120, and also provides an output signal (TEST_OUT) 190 to test circuitry (not shown). The fine boost control signal 130 tracks the current oscillator frequency and makes adjustments as necessary to maintain the oscillator at it's target frequency. The macro delay decode signal 160 is derived from external logic which analyzes the oscillator frequency during initial coarse acquisition of the target frequency. Once coarse acquisition is complete, signal 160 is held at a constant state during oscillator operation. The Osc enable signal 170 is provided by external circuits which control the starting/stopping of the oscillator.

Not only is signal 170 responsible for making the oscillator quiescent, it also controls the selection of the test path through the multiplexer 150. When the test path through the multiplexer 150 is selected via signal 170, the state of the delay chain can be controlled through the TEST_IN signal 185 and observed at the TEST_OUT signal 190. These test control signals may be required for two different types of manufacturing tests. The first is leakage current testing which requires all logic to stop switching, thus eliminating AC current. The second test is stuck fault testing, which requires the ability to switch circuits between their possible states in order to test the circuits themselves, as well as those sourced by the circuit.

Figure 3:
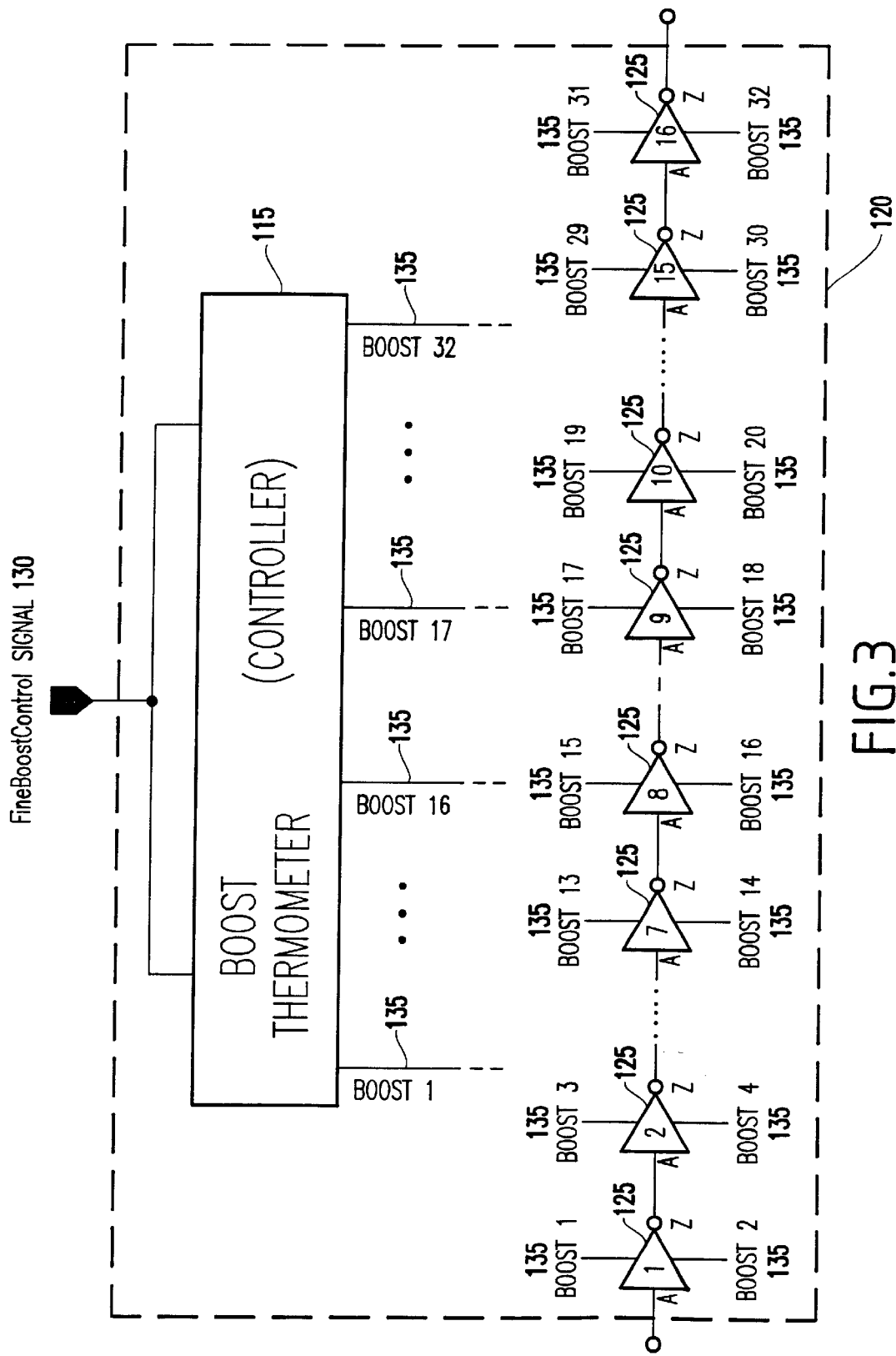
FIG. 3 shows a diagram of the macro delay unit that receives a single boost control signal and distributes individual boost controls to each of the variable delay elements forming the ring inverter circuit.

Referring now to FIG. 3, each macro delay unit 120 has a boost thermometer controller 115 and multiple adjustable delay units 125 connected in series (labeled 1–16 ). Controller 115 is implemented as a thermometer encoder. Its truth table is shown in FIG. 5. Each adjustable delay unit 125 is an adjustable element. The fine boost control input signal 130 provides delay adjustment signals to the controller 115. The boost thermometer controller 115 includes logic circuitry that converts the sub-fine boost control input signals 135 into a thermometer code (discussed below) using two boost signals. The boost signals have the designated voltage-controlled logic states as shown in the table 1 below. They impart the requisite delay for each adjustable delay inverter unit 125.

Figure 4:
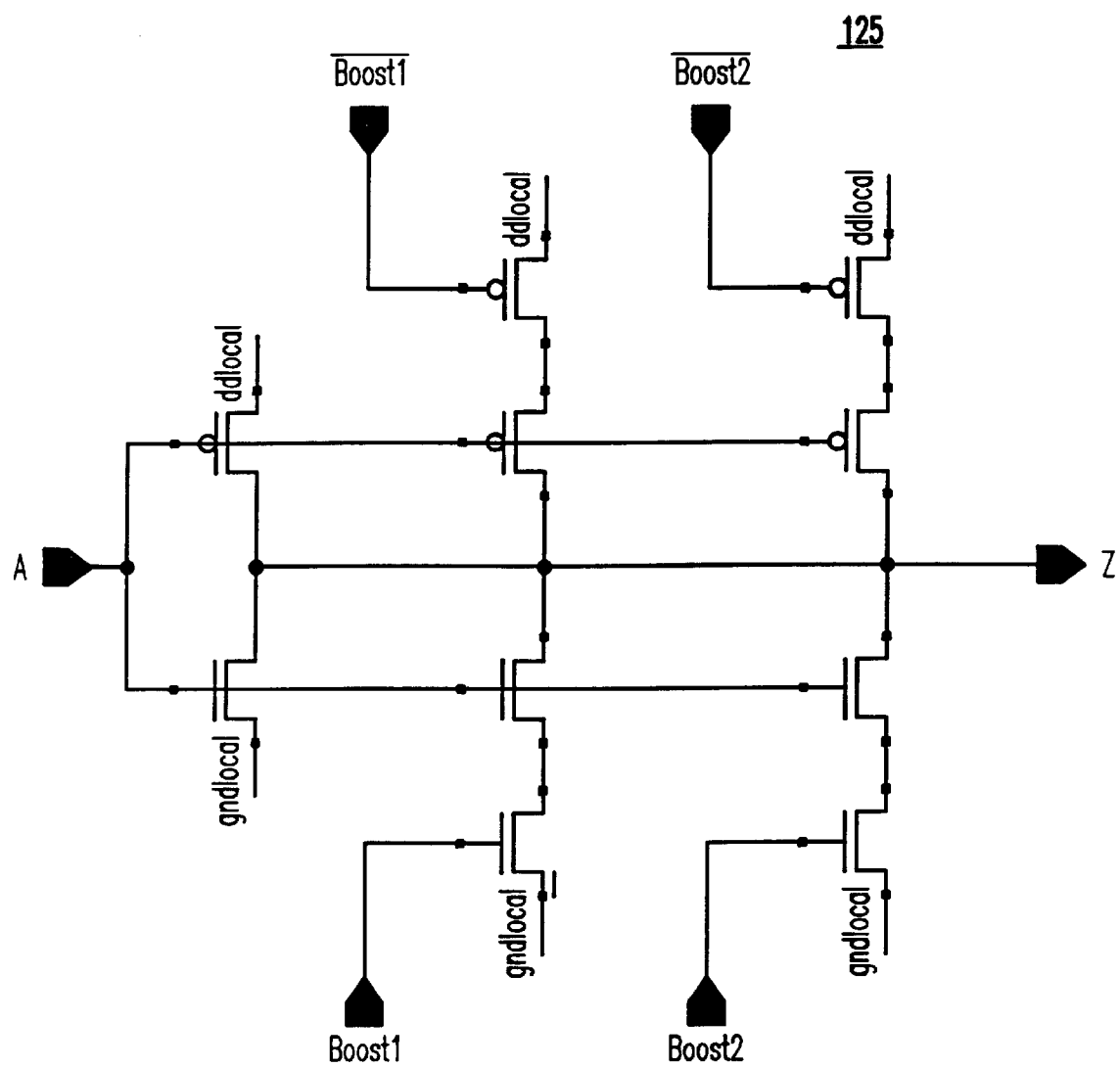
FIG. 4 shows a diagram of the variable delay element in the ring oscillator.

Referring now to FIG. 4, each adjustable delay unit 125 has two input boost signals with corresponding complementary signals as input signals (four input signals total). The inverter circuit has multiple field effect transistors (FETs) that provide operational functioning of each sub-portion of the ring oscillator. An example representative of each of the units 125 is shown in FIG. 4. The nodes labeled "A" and "Z" are the input and outputs for each of the adjustable delay units 125. Boost 1 and boost 2 signals when having logic states as in Table 1 that are controlled by voltage supply logic using the input nodes "vddlocal" and "gndlocal" as shown. Table 1 is as follows:

TABLE 1

| Boost 1 | Boost 2 | Delay (nanoseconds) |
| --- | --- | --- |
| 1 | 1 | Base |
| 1 | 0 | 133% Base |
| 0 | 1 | 166% Base |
| 0 | 1 | Invalid |

These two boost input signals with their corresponding inverted signals provide increased drive to each of the inverter delay units 125, thus shortening delay. The delay unit 125 has an intrinsic delay close to that of a single inverter. The delay through each of the delay units 125 is adjusted by the two boost signals and their corresponding inverted signals.

The fine boost control signal 130 individually controls in the boost 1 and boost 2 signals shown in FIG. 4. If the boost 1 the signal and its complement are on, the appropriate transistors are activated, thereby increasing the drive and shortening the delay. Similarly, the boost 2 signal and its complement can be enabled or disabled to increase the drive and shorten delay. Each set of complementary transistors are individually controlled by the different boost signals within the fine boost control signal 130. Therefore, referring to FIG. 3, boost 1 may be activated while boost 13 or boost 15 are inactivated. This allows precise control of the drive of each of the delay units 125, thereby providing precise control of the delay of the macro delay unit 120.

The digital ring oscillator 100 provides small and consistent frequency steps throughout the locked range. Further, the ring oscillator 100 circuit is standard cell placeable and operates at the technology limits to provide small and precise delay changes and is inexpensive to implement. The digital variable-frequency ring oscillator includes multiple macro delay elements 110 forming the inverter ring circuit, each element having an individual macro delay unit 120 that in turn is comprised of multiple adjustable delay units 125. Each of the delay units 125 are variably controlled by a single delay control signal 130. This design enables consistent and precise frequency adjustments while locked, yet allows full operational range of frequencies without step-type frequency changes.

While the preferred embodiment is a digitally controlled oscillator, the invention is useful in many other structures. For example, another use for the ring would be to precisely control phase and optionally align to a reference or a divided reference signal.

The ring structure is implemented such that the boost control logic can be reused to control any group of adjustable delay elements 125 at a time. The ring is therefore very modular, thus allowing for addition of adjustable delay elements 125 without significant change to the control logic. By using the same single boost control logic (not replicas) to control the groups of adjustable delay elements 125, significant control logic reduction can be realized. When necessary to pass the boost control from one group of adjustable delay elements 125 to another, the transition can be done without physically reconfiguring the ring. Further, the time in which the transition occurs is not dependent on the frequency of the oscillator.

As with conventional truncation loop ring oscillators, the invention has a truncation logic ring-controlled design that provides variable delay by selectively enabling or disabling delay elements 120. However, contrary to conventional designs, the delay elements 120 in the invention are "macro" delay elements and each includes multiple, adjustable delay units 125 to provide a higher resolution of delayed adjustments. In other words, with conventional truncation ring oscillators, there are large steps in timing changes as each delay element is added or removed to/from the ring. To the contrary, with the invention, the multiple adjustable delay units 125 provide a much smoother and higher resolution of timing changes. Therefore, contrary to conventional structures, the invention includes two levels of delay control which provides distinct advantages.

The invention makes large changes in timing by selectively engaging or disengaging the macro delay units 120. After the timing loop has "locked in" to a specific frequency by selecting a specific number of macro delay units 120, the adjustable delay units 125 continue to operate to variably adjust the timing of each of the individual macro delay units 120 to maintain the desired frequency and accommodate for environmental changes (e.g., temperature compensation, drift and voltage fluctuation) that plague conventional oscillators. As described above, each of the variable delay units 125 provides slight increases or decreases in delay as controlled by the fine boost controlled signal 130.

Further, the invention provides a smooth progression of timing delay by selectively increasing/decreasing the delay of each variable delay unit 125 as the macro delay units 120 are engaged/disengaged. Thus, the invention can be programmed to provide a smooth frequency change when engaging/disengaging a macro delay unit 120 by providing a corresponding opposite increase/decrease of the find boost control signal 130. The increase or decrease in timing produced by the change in the fine boost control signal 130 preferably matches the increase or decrease in timing associated with the engaged/disengaged of the additional macro delay unit 120, thereby providing a smooth transition as macro delay units 120 are added or subtracted from the ring loop.

While the invention has been particularly described and illustrated with reference to a preferred embodiment, it will be understood by those skilled in the art that changes in the description or illustrations may be made with respect to form or detail without departing from the spirit and scope of the invention.

What is claimed is:

1. A digital variable delay ring oscillator comprising:
   a ring of macro delay elements;
   a selector connected to said macro delay elements adapted to selectively engage ones of said macro delay elements; and
   a selector controller for controlling said selector,
   wherein said macro delay elements each include a plurality of variable delay elements,
   said oscillator further comprising a fine boost control signal adapted to individually control each of said variable delay elements in each of said macro delay elements, such that, within each of said macro delay elements, some of said variable delay elements may be activated while others of said variable delay elements are inactivated.

2. The oscillator in claim 1, wherein said variable delay elements each include sets of complementary transistors that alter a delay associated with a corresponding variable delay element.

3. The oscillator in claim 1, wherein said variable delay elements reduce an abruptness of timing changes that occur when said macro delay elements are engaged and disengaged.

4. The oscillator in claim 1, wherein said fine boost control signal is adapted to compensate for temperature, drift and voltage fluctuation suffered by said oscillator.

5. The oscillator in claim 1, wherein each of said macro delay elements includes a controller for directing said fine boost control signal to said variable delay elements.

6. The oscillator in claim 1, wherein said variable delay elements each include a plurality of transistors that are controlled by a boost signal to control the variation in delay of said variable delay elements.

7. A digital variable delay ring oscillator comprising:

a ring of macro delay elements, said macro delay elements each including a plurality of serially-connected variable delay elements;

a selector connected to said macro delay elements adapted to selectively engage ones of said macro delay elements;

a selector controller for controlling said selector; and a fine boost control signal that individually varies a delay of each of said variable delay elements, said oscillator further comprising a fine boost control signal adapted to individually control each of said variable delay elements in each of said macro delay elements, such that, within each of said macro delay elements, some of said variable delay elements may be activated while others of said variable delay elements are inactivated.

8. The oscillator in claim 7, wherein said variable delay elements each include sets of complementary transistors that alter a delay associated with a corresponding variable delay element.

9. The oscillator in claim 7, wherein said variable delay elements reduce an abruptness of timing changes that occur when said macro delay elements are engaged and disengaged.

10. The oscillator in claim 7, wherein said fine boost control signal is adapted to compensate for temperature, drift and voltage fluctuation suffered by said oscillator.

11. The oscillator in claim 7, wherein each of said macro delay elements includes a controller for directing said fine boost control signal to said variable delay elements.

12. The oscillator in claim 7, wherein said variable delay elements each include a plurality of transistors that are controlled by a boost signal to control the variation in delay of said variable delay elements.

13. A digital variable delay ring oscillator comprising:

a ring of macro delay elements; and a multiplexor connected to said macro delay elements adapted to selectively engage ones of said macro delay elements by a multiplexor controller, wherein said macro delay elements each include a plurality of variable delay elements, and wherein a delay of said oscillator is controlled by a number of said macro delay elements engaged and a delay setting of each of said variable delay elements, said oscillator further comprising a fine boost control signal adapted to individually control each of said variable delay elements in each of said macro delay elements, such that, within each of said macro delay elements, some of said variable delay elements may be activated while others of said variable delay elements are inactivated.

14. The oscillator in claim 13, wherein said variable delay elements each include sets of complementary transistors that alter a delay associated with a corresponding variable delay element.

15. The oscillator in claim 13, wherein said variable delay elements reduce an abruptness of timing changes that occur when said macro delay elements are engaged and disengaged.

16. The oscillator in claim 13, wherein said fine boost control signal is adapted to compensate for temperature, drift and voltage fluctuation suffered by said oscillator.

17. The oscillator in claim 13, wherein said variable delay elements each include a plurality of transistors that are controlled by a boost signal to control the variation delay of said variable delay elements.

* * * * *